United States Patent [19]
Bertotti et al.

[11] Patent Number: 4,890,149
[45] Date of Patent: Dec. 26, 1989

[54] INTEGRATED DEVICE FOR SHIELDING CHARGE INJECTION INTO THE SUBSTRATE, IN PARTICULAR IN DRIVING CIRCUITS FOR INDUCTIVE AND CAPACITIVE LOADS

[75] Inventors: Franco Bertotti, Milan; Paolo Ferrari, Gallarate; Maria T. Gatti, Milan, all of Italy

[73] Assignee: SGS Microelettronica Spa, Catania, Italy

[21] Appl. No.: 99,044

[22] Filed: Sep. 21, 1987

[30] Foreign Application Priority Data

Sep. 25, 1986 [IT] Italy .................. 21817 A/86

[51] Int. Cl.⁴ .................................. H01L 27/04
[52] U.S. Cl. ............................ 357/48; 357/47; 357/40; 357/41; 357/42; 357/43; 357/44; 357/13
[58] Field of Search ............ 357/41, 35, 48, 34, 357/40, 43, 44, 13, 47

[56] References Cited

U.S. PATENT DOCUMENTS

4,202,006  5/1980  Khajezadeh .............. 357/48 X
4,661,838  4/1987  Wildi et al. ............... 357/43 X

FOREIGN PATENT DOCUMENTS

8300776  3/1983  PCT Int'l Appl. .......... 357/48
2185621  7/1987  United Kingdom ........ 357/48

OTHER PUBLICATIONS

Alameddine, "Protective Circuit for Ingetrated Semiconductor Devices," *IBM Technical Disclosure Bulletin*, vol. 20, No. 10, Mar. 1978, pp. 3962–3963.
No author, "Electronics International", *Electronics*, Aug. 31, 1970, p. 137.

*Primary Examiner*—William Mintel
*Attorney, Agent, or Firm*—Guido Modiano; Albert Josif

[57] ABSTRACT

This integrated device for shielding injected charges in driving circuits for inductive and/or capacitive loads comprises four integrated structures including a first barrier region with high resistivity which surrounds the buried layer of the epitaxial flyback pocket which may be set at a potential lower than ground on the side of the buried layer which faces the driving circuit pocket; a first charge collecting region provided in the epitaxial flyback pocket; a third low-loss diode structure, formed in an epitaxial pocket which is isolated from the flyback pocket and is arranged between the latter and the driving circuit, and connected so as to clamp the voltage between the epitaxial flyback pocket and the substrate to the diode direct conduction voltage; and, finally, a last barrier structure formed by a charge collecting region connected to the supply voltage.

10 Claims, 1 Drawing Sheet

INTEGRATED DEVICE FOR SHIELDING CHARGE INJECTION INTO THE SUBSTRATE, IN PARTICULAR IN DRIVING CIRCUITS FOR INDUCTIVE AND CAPACITIVE LOADS

BACKGROUND OF THE INVENTION

The present invention relates to an integrated device for shielding charge injection into the substrate, in particular in driving circuits for inductive and capacitive loads.

As is known, during the driving of inductive and/or capacitive loads, in order to achieve a correct behaviour of the system it is necessary to discharge the current accumulated at the load towards the ground or towards the supply. When load driving is performed by means of integrated devices, the substrate of the device is generally clamped to the ground and the current is discharged through the diode formed by the junction of an epitaxial pocket connected to the load (which pocket defines the cathode) and substrate (which defines the anode of the diode). In order to allow flyback of the current upon switching off of the load driving devices, this diode is directly biased and the epitaxial pocket reaches a negative voltage with respect to the ground.

In this condition, the epitaxial pocket with negative voltage injects current into the substrate, behaving like the emitter of a parasitic NPN transistor, and every other epitaxial pocket of the same device which is at a greater voltage with respect to the substrate collects the injected electrons behaving like the collector of the parasitic transistor having the substrate for base and the negative epitaxial pocket for emitter.

This injection of charges in epitaxial pockets which are at high voltage entails some problems and therefore must be avoided. In fact, in particular, it causes an undesired dissipation of power; if the epitaxial pocket which is at high voltage is the base of a PNP transistor, it causes switching-on of said lateral PNPs (including, for example, the driving ones); it furthermore causes an increase in the base current of the lateral PNP transistors, thus causing a malfunction in the device.

In order to avoid the above described problems, two solutions are currently used, both having the purpose of creating a path which has lower impedance than the other epitaxial pockets of the circuit and therefore such as to collect all the current injected by the epitaxial pocket which is at a negative voltage with respect to the ground. Such solutions have a similar structure which comprises an isolated epitaxial pocket which surrounds the entire epitaxial pocket which can reach a negative voltage with respect to the ground. Said isolated pocket comprises, in its interior, a buried layer, as well as a sinker layer, which are more heavily doped than the epitaxial layer. This structure is illustrated for the sake of clarity in FIG. 1 and can be connected to the ground or to the power supply.

Though these solutions partially improve the problem, they are however still unsatisfactory since they are unable to completely eliminate the current towards other active regions of the circuit, and they do not reduce the dissipated power. Moreover, in particular, the solution comprising the connection to the ground is scarcely competitive with respect to high-voltage epitaxial pockets which tend to provide a better collecting of the charges injected by the negative voltage epitaxial pocket, thus producing results which are not fully satisfactory. On the contrary, the solution wherein the described structure is connected to the power supply has a better behavior as to collection of the injected current, but it is disadvantageous in terms of power dissipation since the current of the parasitic transistor is collected towards the point at the highest voltage.

SUMMARY OF THE INVENTION

Given this situation, the aim of the present invention is to provide an integrated device for shielding charge injection into the substrate, in particular in driving circuits for inductive and/or capacitive loads, which eliminates the disadvantages of the prior art.

Within this aim, a particular object of the present invention is to provide an integrated device which is highly efficient in collecting the current injected by the region which has reached a negative voltage with respect to the ground so as to completely exclude triggering of other transistors of the device, or their increase in current, thus eliminating this cause of circuit malfunction.

Another object of the present invention is to provide an integrated device which reduces the power dissipated in the circuit, thus improving the reliability and increasing the applications of the circuit.

Not the least object of the present invention is to provide an integrated device which has a conceptually simple structure which can be easily manufactured using the methods and the machines currently in use for the production of integrated electronic devices, so as to not entail a substantial complication in the production of the entire circuit and therefore such as to have modest manufacturing costs.

The aim described, the objects mentioned, and others which will become apparent hereinafter, are achieved by an integrated device for shielding charge injection into the substrate, in particular in driving circuits for inductive and capacitive loads, as defined in the appended claims.

BRIEF DESCRIPTION OF THE DRAWINGS

The features and advantages of the invention will become apparent from the description of a preferred, but not exclusive, embodiment, illustrated only by way of nonlimitative example in the accompanying drawings, wherein.

DESCRIPTION OF THE PREFERRED EMBODIMENTS

Figure 1:
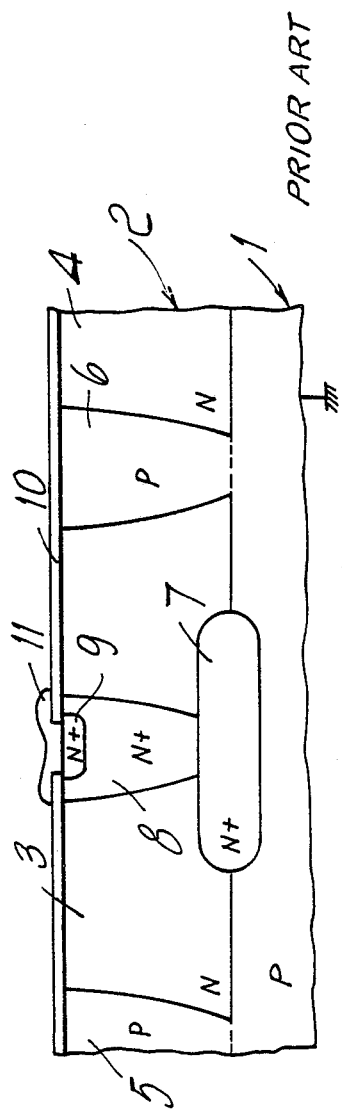
FIG. 1 is a transverse cross section view through a small semiconductor wafer, illustrating a protection structure according to the prior art.

Initially, reference is made to FIG. 1, which illustrates the structure of the known protection solutions. In detail, FIG. 1 illustrates a substrate 1, here having P-type conductivity, as well as an epitaxial layer 2, here of N-type conductivity. Inside the substrate 2, isolating regions 5 and 6 having a P-type conductivity are provided and extend from the main face of the device to the substrate 1 and divide the epitaxial layer 2 into a plurality of isolated pockets or tubs, whereof the figure illustrates the pocket 3, which accommodates the protection device; and the pocket 4, which constitutes, for example, the pocket connected to the load and intended to reach a lower voltage than the substrate in certain operating states of the circuit to be protected. A buried layer 7, with N+ conductivity, extends along a part of the junction between the substrate and the isolated epitaxial pocket 3. Above and in contact with the buried layer 7, a sinker region 8, having N+ conductivity, is provided and extends up to the main surface of the device. At said face, inside the sinker region, a region 9 with N+ conductivity is provided, and is produced during the emitter diffusion phase of the associated circuit. Above the main face of the device, an oxide layer 10 is deposited, such layer 10 having a through hole overlying the region 9, to allow formation of a contact 11 for connecting the protective structure to the ground or to the supply. Though it is not illustrated, the isolated structure formed by the epitaxial pocket 3 and including the layers 7 to 9 completely surrounds the epitaxial pocket the potential whereof may become lower than the ground.

Figure 2:
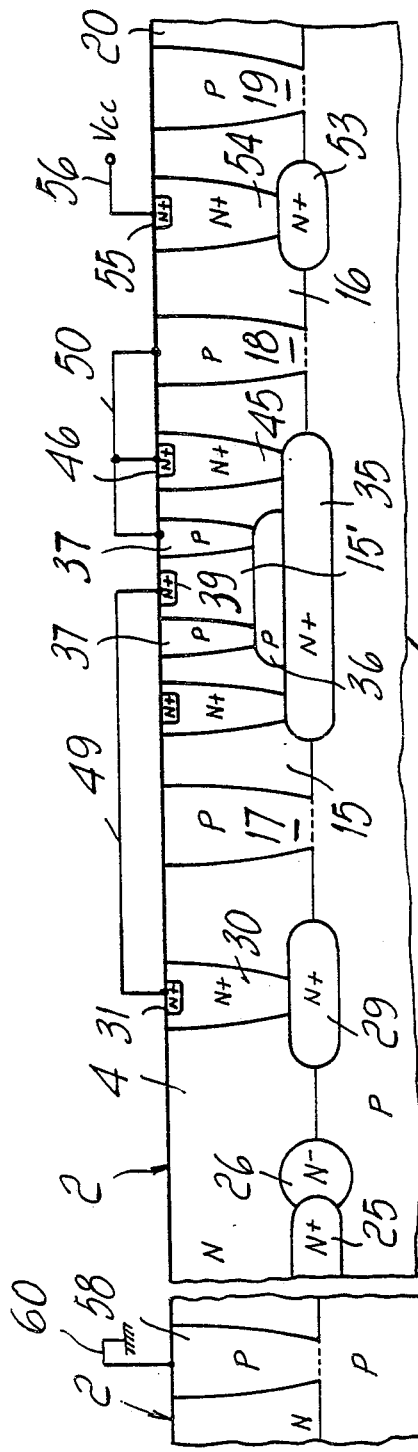
FIG. 2 is a transverse cross section view through a silicon wafer accommodating the integrated device according to the invention.

FIG. 2 instead illustrates the structure of the integrated protection device according to the invention. In this figure, the substrate with P-type conductivity and the epitaxial layer with N-type conductivity have again been respectively indicated at 1 and 2. Here, too, 4 indicates the epitaxial pocket connected to the load adapted to discharge the flyback current of the load and thus to reach a lower voltage with respect to the ground in certain operating phases of the circuit to be protected. Thus, from now on, this pocket 4 will be also indicated as "under-ground pocket" or "flyback pocket". In the present case, the under-ground epitaxial pocket 4 is separated from the rest of the circuit by the isolating region 17, having P-type conductivity, while further isolating regions 18, 19 with P-type conductivity define further isolating epitaxial pockets, indicated by the reference numerals 15, 16 and 20. Let's suppose that the epitaxial pocket 20 accommodates the components forming, together with the under-ground epitaxial pocket 4, the driving circuit. Thus in the present embodiment, the epitaxial pocket 20 is the part of the circuit which should be shielded from the charges injected by the under-ground epitaxial pocket 4, during the flyback operation of the driving circuit.

As can be noted, the present embodiment comprises four structures appropriately formed and arranged so as to completely eliminate the flow of charges from the epitaxial pocket 4 towards further epitaxial pockets of the device, possibly at high voltage.

In detail, the first protection structure consists of the region 26 with N−-type conductivity formed by diffusion prior to the forming of the buried layer 25 with N+-conductivity and extending between the under-ground epitaxial pocket 4 and the substrate 1. In particular, the region 26, having a lower doping level than the buried layer 25, and a greater resistivity 7 extends all around the buried layer 25 on the side thereof looking towards the circuit to be shielded (that is, as above indicated, the epitaxial pocket 4, on the right of FIG. 2). In fact, by virtue of the greater resistivity of the layer 26 (which formes a bottom N-well region and is hereinafter also defined as barrier region), a decrease in the charge injection efficiency from the epitaxial flyback pocket 4 layer which may form the emitter of parasitic transistors NPN having the substrate 1 as base and regions with N-type conductivity with appropriate voltage as collector.

The second structure constituting the protection device according to the invention is formed by the buried layer 29, with N+-type conductivity, extending on the junction between the epitaxial flyback pocket 4 and the substrate 1, and by the sinker layer 30, also having N+-type conductivity and extending from the buried layer 29 up to the main surface of the device. At said surface, the sinker layer 30 accommodates a region 31 with N+-type conductivity diffused during the emitter diffusion step for manufacturing the driving circuit. Said region 31 is electrically connected to the third structure, as will be described hereinafter. The structure formed by the regions 29 and 30 acts as a first picking-up collector for collecting the electrons injected by the epitaxial flyback pocket 4 towards the ground, contributing to the absorption of the injected charges.

The third protective structure of the device according to the invention is formed in an isolated epitaxial pocket, indicated at 15 in the drawing and delimited by the regions 17 and 18. Said structure is provided to the side of the epitaxial flyback pocket, between the latter and the circuit to be shielded (pocket 20). In detail, the third structure constitutes a low-loss diode used to clamp the base-emitter voltage of the NPN parasitic transistor to its direct operating voltage, and is also used as a second charge collector. In particular, said per se known structure comprises a buried layer 35 with N+-type conductivity extending inside the region delimited by the isolating layers 17 and 18 on the junction between the epitaxial pocket 15 and the substrate 1. Above the buried layer 35, an implanted isolation layer 36 with P-type conductivity is provided, extending adjacent to the buried layer 35 and in contact therewith along a part of its extension. Above said isolating layer 36, an isolating layer 37 is furthermore formed and extends inside the epitaxial pocket 15 between the main surface of the device and the isolating layer 36. In practice the region 37, which, in top plan view, forms an isolating ring, divides an inner portion of the epitaxial pocket 15, here indicated by 15', from the rest of the pocket. In turn the inner portion 15' of the epitaxial pocket accommodates, at the main surface of the device, a layer 39 with N+-type conductivity which, together with the pocket 15', defines the cathode of the low-loss diode having its anode formed by regions 36, 37 said cathode being connected, by means of a metal layer schematically illustrated at 49 in FIG. 2, to the region 31 and thereby to the first collecting collector defined by the structure 29–30. The diode furthermore comprises a sinker layer 45 with N+-type conductivity extending from the main surface of the device to the buried layer 35 to the side of the isolating layer 36. Inside the sinker layer 45, on the main face of the device, the region 46 with N+-type conductivity is furthermore formed and, by means of the short-circuit contact 50, electrically connected to the isolating regions 37 and 18. Accordingly, by virtue of the configuration of the low-loss diode and of its connection, the base-emitter voltage of any parasitic NPN transistor is clamped to the direct conduction voltage of the low-loss diode. In this manner, therefore, an excessive increase of said base-emitter voltage is prevented, therefore reducing the efficiency of such parasitic transistors, with a reduction of the charge injected by the under-ground epitaxial pocket 4. Moreover, the sinker structure 45 acts as a second collector for collecting the injected charges, operating like a collector of a parasitic transistor also formed by the substrate 1 as base and by the flyback pocket 4 as emitter.

Finally, the fourth structure which constitutes the shielding integrated device according to the invention comprises a buried layer 53 with N+-type conductivity extending between the junction formed, on the one side by the substrate 1 and, on the other side, by the isolated epitaxial pocket 16 and a sinker layer 54 with N+-type conductivity, extending from the main surface of the device to the buried layer 53. Also in this case, inside the sinker layer 54 a region 55 is provided having N+-type conductivity, also formed during the emitter diffusion step so as to reduce the thickness of the oxide at the terminal. In fact said region 55 is connected, by means of an adapted metal layer schematically indicated by 56 in the figure, to the supply voltage $V_{cc}$. In practice this last structure acts as a third collector for collecting or picking up charges and has the function of collecting the residual charges which have escaped the structure formed by the layers 29 and 30 and the structure formed by the layers 35 and 45.

The circuit is completed by a ground contact at the edge of the wafer which accommodates the complete system formed by the driving circuit plus protection or shielding device, the latter being normally provided at the edge of the wafer. Said ground contact is formed on the isolating region 58 and is connected to the ground by means of a suitable metal layer, as schematically shown in FIG. 2 at 60. In this manner it is possible to reduce the series resistance of the substrate diode, so as to increase its efficiency in injection towards the edge of the wafer.

In practice, as mentioned earlier, the four mutually adjacent structures cooperate so as to effectively absorb the injected charges and to reduce the injection efficiency of the formed parasitic transistors. In particular, by means of the illustrated structure, the maximum efficiency of the shielding device is obtained, by virtue whereof the problem of the charges injected by the epitaxial flyback layer towards the substrate is completely solved, since said charges are "picked up" by three adjacent structures so as to prevent, in practice, the migration thereof towards the high-voltage epitaxial pockets forming the associated driving circuit.

By means of the protection device according to the invention, a decrease in dissipated power is furthermore obtained by virtue of the reduction of the efficiency of the formed parasitic transistors, and of the collection of most of the injected charges towards the ground through paths (scribing lines) which do not pass close to the driving circuit. The shielding effect is completed by the fourth structure connected to the supply voltage, which, however, has a low dissipation since the level of the current reaching said structure is by then reduced by the preceding structures, arranged between the flyback pocket and this high voltage structure.

The invention thus conceived is susceptible to numerous modifications and variations, all of which are within the scope of the inventive concept.

In particular, it should be stressed that, although the best results have been achieved with a protection device formed by all four structures, it is howeveer possible to provide a less number of structures and in whatever combination. Furthermore, the shapes and dimensions may be any according to the requirements.

We claim:

1. An integrated device for shielding charge injection into a semiconductor substrate, in particular, in driving circuits for inductive and capacitive loads, comprising:
   a substrate having a first conductivity type,
   an epitaxial layer superimposed on said substrate, having a second conductivity type opposite to said first conductivity type and defining a main face of the device, said epitaxial layer and said substrate defining together a junction,
   a plurality of isolating regions having said first conductivity type, extending transversely to said epitaxial layer from said main face to said substrate and forming, in said epitaxial layer, at least one isolated epitaxial flyback pocket, said isolated epitaxial flyback pocket being connected to a load to discharge a flyback current and forming a flyback diode together with said substrate along a segment of said junction, and at least one circuit isolated epitaxial pocket accommodating the components of the circuit to be shielded;
   a buried layer of said second conductivity type extending between said epitaxial flyback pocket and said substrate along a first part of said segment of said junction, said buried layer having a side delimitation edge in a direction towards said circuit isolated epitaxial pocket, and
   a distinct barrier region of said second conductivity type, said distinct barrier region being less doped than said buried layer and having a resistivity higher than said buried layer, said barrier region extending between said epitaxial flyback pocket and said substrate along a second part of said segment adjacent to said side delimitation edge of said buried layer in a direction towards said circuit isolated epitaxial pocket.

2. An integrated device according to claim 1, wherein said epitaxial flyback pocket accomodates a first charge collecting region, having said second conductivity type, extending transversely to said epitaxial flyback pocket between said main face and said substrate, said first charge collecting region being isolated from said buried layer.

3. An integrated device according to claim 1, further comprising a second isolated epitaxial pocket arranged between said epitaxial flyback pocket and said circuit isolated epitaxial pocket, said second insulated epitaxial pocket accommodating regions having P and N type conductivity defining a low-loss diode having an anode and a cathode terminal said anode terminal being electrically connected to at least one of said isolating regions of said first conductivity type, said low-loss diode comprising a charge collecting region having said second conductivity type, extending between said substrate and said main face and being electrically connected to said isolating regions.

4. An integrated device according to claim 1, further comprising a further isolated epitaxial pocket, arranged between said flyback epitaxial pocket and said circuit isolated epitaxial pocket, said further isolated epitaxial pocket accommodating a charge collecting region having said second conductivity type, extending transversely to said further epitaxial pocket between said substrate and said main face, said collecting region being connected to a circuit reference voltage.

5. An integrated device according to claim 2, wherein said first charge collecting region comprises a buried layer which extends between said epitaxial flyback pocket and said substrate and a sinker region which extends between said buried layer and said main face, said buried layer and said sinker region having a greater doping than said epitaxial flyback pocket.

6. An integrated device according to claim 4, wherein said charge collecting region comprises a buried layer having said second type conductivity, extending between said further isolated epitaxial pocket and said substrate and a sinker region having said second type conductivity, extending between said buried layer and said main face, said buried layer and said sinker region having a higher doping than said further isolated epitaxial pocket.

7. An integrated device according to claim 3, wherein said low-loss diode comprises a buried layer extending between said substrate and said second isolated epitaxial pocket and having said second conductivity type, an isolating layer having said first conductivity type extending in said second isolated epitaxial pocket in contact with said buried layer, an isolation region of said first conductivity type, extending between said isolating layer and said main face, said isolating layer and said isolation region delimiting and isolating from each other an inner portion and an outer portion of said second isolated epitaxial pocket and forming with said inner portion a junction which defines said low-loss diode, and said charge collecting region being formed by a sinker layer having said second type of conductivity, said sinker layer extending laterally to said isolating layer and said isolation region, between said main face and said buried layer.

8. An integrated device according to claim 1, comprising a further isolating region of said first conductivity type, delimiting said epitaxial flyback pocket and connected to ground.

9. An integrated device for shielding charge injection into a semiconductor substrate, in particular in driving circuits for inductive and capacitive loads, comprising:
a substrate having a first conductivity type,
an epitaxial layer superimposed on said substrate, having a second conductivity type opposite to said first conductivity type and defining a main face of the device, said epitaxial layer and said substrate defining together a junction,
a plurality of isolating regions having said first conductivity type extending transversely to said epitaxial layer from said main face to said substrate and forming, in said epitaxial layer, at least one isolated epitaxial flyback pocket, said isolated epitaxial flyback pocket being connected to a load to discharge a flyback current and forming a flyback diode together with said substrate along a segment of said junction, and at least one circuit isolated epitaxial pocket accommodating components of the circuit to be shielded;
a buried layer having said second conductivity type extending between said epitaxial flyback pocket and said substrate along a first part of said segment of said junction, said buried layer having a side delimitation edge in a direction towards said circuit isolated epitaxial pocket,
a distinct barrier region having said second conductivity type, said distinct barrier region being less doped than said buried layer, and have a resistivity higher than said buried layer, said barrier region extending between said epitaxial flyback pocket and said substrate along a second part of said segment of said junction adjacent to said buried layer at least at said side delimitation edge,
a first charge collecting region, having said second conductivity type, extending in said epitaxial flyback pocket transversely thereto between said main face and said substrate,
a second isolated epitaxial pocket arranged between said epitaxial flyback pocket and said circuit isolated epitaxial pocket, said second isolated epitaxial pocket accommodating regions having P and N type conductivity defining a low-loss diode having an anode and a cathode terminal, said cathode terminal being electrically connected to said first charge collecting region and said anode terminal being short-circuited to at least one of said isolating regions, said low-loss diode comprising a second charge collecting region having said second conductivity type, extending between said substrate and said main face, being electrically connected to said isolating regions, and to said anode terminal,
a third isolated epitaxial pocket, arranged between said second isolated epitaxial pocket and said circuit isolated epitaxial pocket, said third epitaxial pocket accommodating a third charge collecting region having said second conductivity type extending transversely to said third epitaxial pocket between said substrate and said main face, said third collecting region being connected to a circuit supply voltage.

10. An integrated device according to claim 9, wherein said first conductivity type is of P type and said second conductivity type is of N type.

* * * * *